United States Patent
Mayer et al.

(10) Patent No.: US 12,124,329 B2
(45) Date of Patent: *Oct. 22, 2024

(54) TRANSMISSION FAILURE FEEDBACK SCHEMES FOR REDUCING CROSSTALK

(71) Applicant: Micron Technology, Inc., Boise, ID (US)

(72) Inventors: Peter Mayer, Neubiberg (DE); Thomas Hein, Munich (DE); Martin Brox, Munich (DE); Wolfgang Anton Spirkl, Germering (DE); Michael Dieter Richter, Ottobrunn (DE)

(*) Notice: Subject to any disclaimer, the term of this patent is extended or adjusted under 35 U.S.C. 154(b) by 0 days.

This patent is subject to a terminal disclaimer.

(21) Appl. No.: 18/211,472

(22) Filed: Jun. 19, 2023

(65) Prior Publication Data

US 2024/0095119 A1 Mar. 21, 2024

Related U.S. Application Data

(63) Continuation of application No. 17/493,985, filed on Oct. 5, 2021, now Pat. No. 11,709,730, which is a
(Continued)

(51) Int. Cl.
*G06F 11/10* (2006.01)
*G11C 29/42* (2006.01)

(52) U.S. Cl.
CPC ...... *G06F 11/1044* (2013.01); *G06F 11/1016* (2013.01); *G06F 11/1028* (2013.01); *G11C 29/42* (2013.01)

(58) Field of Classification Search
CPC .. G11C 29/42; G06F 11/1044; G06F 11/1028; G06F 11/1016
See application file for complete search history.

(56) References Cited

U.S. PATENT DOCUMENTS

| 4,543,628 A | * | 9/1985 | Pomfret | ............... G06F 11/0793 714/48 |
| 5,231,640 A | * | 7/1993 | Hanson | ............... G06F 11/1695 714/E11.041 |

(Continued)

FOREIGN PATENT DOCUMENTS

| CN | 102084430 A | 6/2011 |
| CN | 104407929 A | 3/2015 |

(Continued)

OTHER PUBLICATIONS

European Patent Office, "Partial Search Report," issued in connection with European Patent Application No. 19851730.2, dated Nov. 26, 2021 (13 pages).

(Continued)

*Primary Examiner* — Samir W Rizk

(57) ABSTRACT

Systems, apparatuses, and methods for transmission failure feedback associated with a memory device are described. A memory device may detect errors in received data and transmit an indication of the error when detected. The memory device may receive data and checksum information for the data from a controller. The memory device may generate a checksum for the received data and may detect transmission errors. The memory device may transmit an indication of detected errors to the controller, and the indication may be transmitted using a line that is different than an error detection code (EDC) line. A low-speed tracking clock signal may also be transmitted by the memory device over a line different than the EDC line. The memory device may transmit a generated checksum to the controller with a time offset applied to the checksum signaled over the EDC line.

20 Claims, 9 Drawing Sheets

Related U.S. Application Data continuation of application No. 16/538,537, filed on Aug. 12, 2019, now Pat. No. 11,144,385.

(60) Provisional application No. 62/720,385, filed on Aug. 21, 2018.

(56) References Cited

U.S. PATENT DOCUMENTS

| | | | |
|---|---|---|---|
| 2005/0240855 A1 | 10/2005 | Tseng et al. | |
| 2008/0104480 A1 | 5/2008 | Tseng et al. | |
| 2009/0235113 A1* | 9/2009 | Shaeffer | G06F 11/1004 714/2 |
| 2009/0313533 A1* | 12/2009 | Bains | G06F 11/1004 714/E11.032 |
| 2010/0058144 A1* | 3/2010 | Rohleder | G06F 11/1016 714/763 |
| 2012/0185752 A1* | 7/2012 | Maheshwari | G06F 11/1076 714/768 |
| 2013/0254585 A1* | 9/2013 | Zerbe | G06F 1/08 713/503 |
| 2013/0326257 A1 | 12/2013 | Fujimoto | |
| 2013/0332783 A1 | 12/2013 | Troia | |
| 2014/0298119 A1 | 10/2014 | Laberge et al. | |
| 2015/0355964 A1 | 12/2015 | Tsern et al. | |
| 2015/0363260 A1 | 12/2015 | Hollis | |
| 2017/0147432 A1 | 5/2017 | Suh et al. | |
| 2017/0359084 A1* | 12/2017 | Yun | H03M 13/11 |
| 2018/0005686 A1 | 1/2018 | Oh et al. | |
| 2018/0107542 A1 | 4/2018 | Ware et al. | |
| 2019/0155671 A1* | 5/2019 | Pao | G06F 11/1068 |
| 2019/0347159 A1 | 11/2019 | Chang et al. | |
| 2020/0136754 A1* | 4/2020 | Hoermaier | H04L 1/0041 |
| 2021/0185752 A1 | 6/2021 | Samuel et al. | |

FOREIGN PATENT DOCUMENTS

| | | |
|---|---|---|
| CN | 104428756 A | 3/2015 |
| CN | 107545915 A | 1/2018 |
| CN | 108292248 A | 7/2018 |
| KR | 10-2014-0039948 A | 4/2014 |

OTHER PUBLICATIONS

European Search Report and Search Opinion received for EP Application No. 19851730.2, mailed on Nov. 26, 2021, 13 pages.

European Supplementary Search Report and Search Opinion Received for EP Application No. 19851730.2, mailed on Mar. 3, 2022, 12 pages.

International Search Report and Written Opinion received for PCT Patent Application No. PCT/US19/46400, mailed on Dec. 3, 2019, 10 pages.

Korean Patent Office, "Office Action," issued in connection with Korean Patent Application No. 10-2021-7007546 dated Feb. 16, 2023 (19 pages) (10 pages of English Translation and 9 pages of Original Document).

Chinese patent office, "China Office Action," issued in connection with China Patent Application No. 201980053500.2 dated Apr. 3, 2024 (14 pages) (5 pages of English Translation and 9 pages of Original Document).

* cited by examiner

TRANSMISSION FAILURE FEEDBACK SCHEMES FOR REDUCING CROSSTALK

CROSS REFERENCE

The present application for patent is a continuation of U.S. patent application Ser. No. 17/493,985 by Mayer et al., entitled "TRANSMISSION FAILURE FEEDBACK SCHEMES FOR REDUCING CROSSTALK," filed Oct. 5, 2021, which is a continuation of U.S. patent application Ser. No. 16/538,537 by Mayer et al., entitled "TRANSMISSION FAILURE FEEDBACK SCHEMES FOR REDUCING CROSSTALK," filed Aug. 12, 2019, which claims priority to U.S. Provisional Patent Application No. 62/720,385 by Mayer et al., entitled "TRANSMISSION FAILURE FEEDBACK SCHEMES FOR REDUCING CROSSTALK," filed Aug. 21, 2018, each of which is assigned to the assignee hereof and each of which is expressly incorporated by reference in its entirety.

BACKGROUND

The following relates generally to a system that includes at least one memory device and more specifically to transmission failure feedback schemes for reducing crosstalk.

Memory devices are widely used to store information in various electronic devices such as computers, wireless communication devices, cameras, digital displays, and the like. Information is stored by programing different states of a memory device. For example, binary devices may store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source.

Memory devices may include various channels for communicating information with other devices (e.g., a controller) within a system. For instance, a memory device may use one or more channels for transmitting and/or receiving data from a controller, but improved signaling between a controller and a memory device for error detection and other functions may be desired.

DETAILED DESCRIPTION

Figure 1:
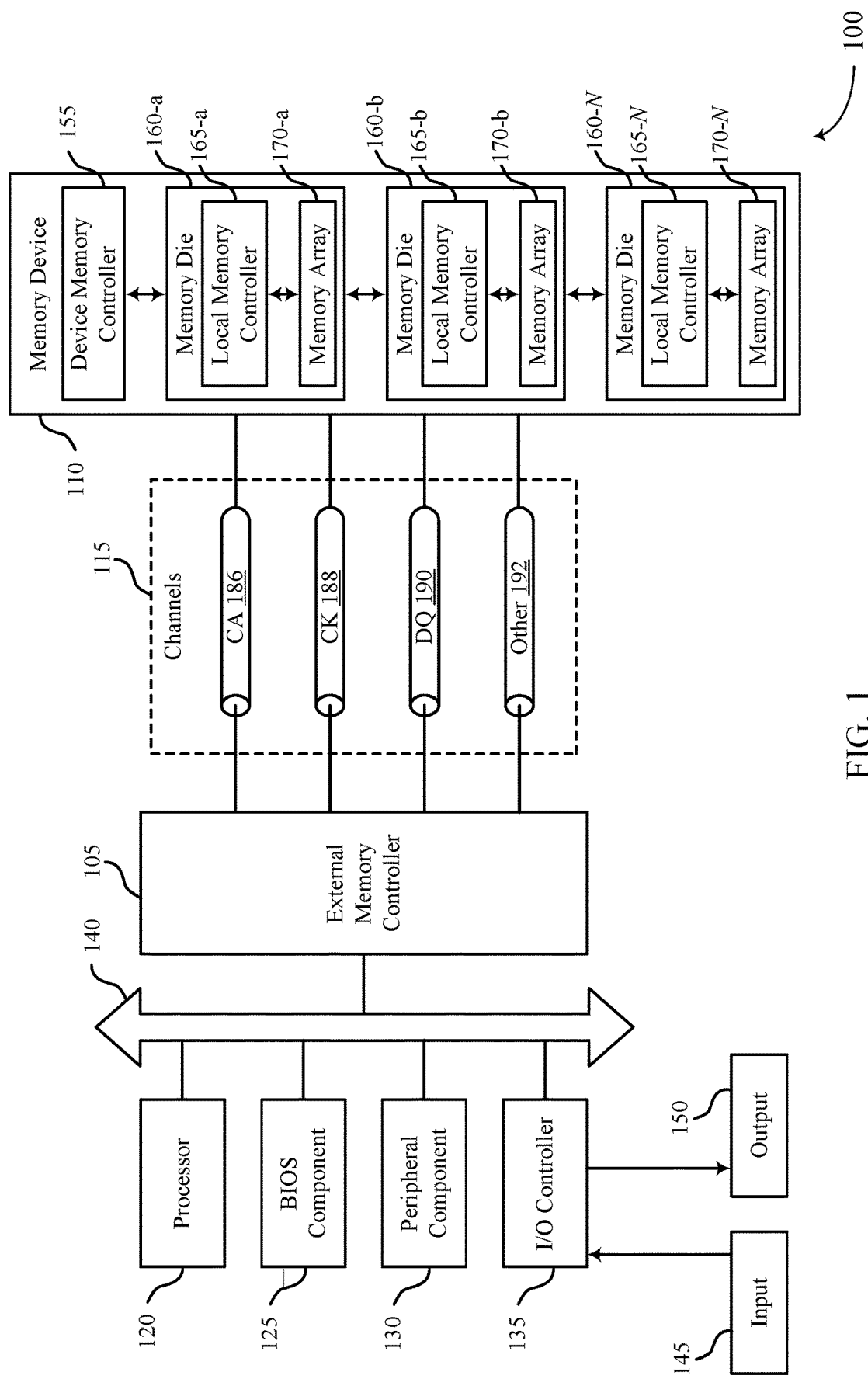
FIG. 1 illustrates an example of a system that supports transmission failure feedback schemes for reducing crosstalk in accordance with examples as disclosed herein.

A memory device may communicate with another device (e.g., a controller or host device, such as a graphics processing unit (GPU), general purpose GPU (GPGPU), central processing unit (CPU)) over one or more channels. Such channels (e.g., corresponding to conductive lines) may couple a pin of the memory device with a pin of the other device. For example, these channels may couple a data (DQ) pin of the memory device with a corresponding pin of the other device, and data may be communicated between the memory device and the other device over one or more data lines. As such, these data lines may be used for receiving data to be written to an array of memory cells at the memory device (e.g., for write operations) and used for transmitting data from the memory device to the other device (e.g., for read operations).

In some cases, an error detection code (EDC) line may enable the transmission of various types of information from the memory device. For example, the EDC line may be used to transmit error detection information (e.g., a checksum) regarding data received from a controller during a write operation. In such cases, upon receiving data to be written to the array of memory cells, the memory device may generate a checksum that is derived from the received data and used to identify transmission errors. This checksum may be transmitted back to the controller via the EDC line, and the controller may then compare the checksum received from the memory device to checksum information for the transmitted data (e.g., known by the controller prior to transmission) and the checksum received from the memory device. Based on the comparison of the respective checksums, the controller may determine whether the data received at the memory device has errors, and may retransmit the data if errors are detected. In other examples, the memory device may transmit other types of signals (e.g., clock signals representative of the timing of the memory device, holder patterns) using the EDC line.

Information transmitted via the EDC line, however, may cause interference to one or more signals transmitted on data channels. For example, the EDC line may be located nearby (e.g., adjacent to) one or more data lines, and data transmissions may be affected by crosstalk from the various signals transmitted on or related to the EDC line. This crosstalk may create undesired effects on the data received on the data lines through coupling (e.g., capacitive coupling) of EDC signals to data sent on one or more data lines. As a result, increased errors in the received data may lead to rewriting data more frequently, thus introducing inefficiencies and latency into the system and its operation.

As described herein, various techniques may allow for the feedback of information from a memory device to another device, such as a controller, while reducing or eliminating crosstalk. For example, transmission error information (e.g., information that indicates an error has been detected for received data) may be transmitted from the memory device when errors are detected in the data, thus reducing the frequency at which signaling is transmitted against (e.g., in the opposite direction of) received data. In some cases, the transmission error information may be sent on a line that is different than the EDC line (e.g., a line located away from data lines) to reduce or eliminate crosstalk onto the data lines.

The transmission error information may be determined at the memory device by comparing checksum information received from another device (e.g., the controller transmitting the data) and a checksum generated by the memory device. Based on the comparison, the memory device may identify errors in received data and, in turn, transmit the transmission error information (e.g., a binary indication sent using one bit) as needed. The memory device may also transmit clock signals (e.g., a low-speed tracking clock) to the other device using a line different than the EDC line (which may be the same as or different than the line used for transmitting the transmission error information). As a result, the EDC line may not be used for transmitting information from the memory device while data is received at the memory device, thereby reducing crosstalk from signaling sent on the EDC line.

Additionally or alternatively, a delay or timing offset may be introduced to signaling sent by the memory device on the EDC line, which may likewise result in reducing or eliminating crosstalk. For example, when transmitting a generated checksum to a controller via the EDC line, a trimmable offset may be applied to the timing of the checksum transmission. By temporally shifting the signal transmitted on the EDC line, crosstalk may be reduced or eliminated through coherently introduced delays that reduce crosstalk from EDC signaling on data received at the memory device. In some cases, the timing offset may be selected (e.g., at powerup) from a set of determined offsets, where the determined offsets may be based on one or more operating conditions of the memory device.

Features of the disclosure are described below at an exemplary memory system level in the context of FIG. 1 and are further described with regard to an exemplary memory device in the context of FIG. 2. Specific examples of systems and techniques used for transmission error feedback are then described in the context of FIGS. 3 through 5. These and other features of the disclosure are further illustrated by and described with reference to flowcharts of FIGS. 7 and 8 that relate to transmission failure feedback schemes for reducing crosstalk.

FIG. 1 illustrates an example of a system 100 that includes devices that support transmission failure feedback schemes for reducing crosstalk in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be a component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may support techniques for reducing crosstalk when transmitting or receiving information. As an example, and as described in further detail below, the memory device 110 may be configured with channels (e.g., dedicated channels) for clock signals and/or error indications for received data. In some cases, the channels may be different than an EDC channel (e.g., a channel that is used for communicating EDC information). Additionally, the memory device 110 may be configured to detect the errors in data to be written to an array of memory cells, where the error detection may be based on information (e.g., checksum information) received from a device that transmitted the data (such as the external memory controller 105). In some examples, the memory device 110 may also be configured to introduce a timing offset in signaling sent via the EDC channel.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O)

controller 135. The components of system 100 may be coupled with or in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a CPU, a GPU, GPGPU, or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 125 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 125 may be other components as would be understood by persons of ordinary skill in the art as peripherals.

The I/O controller 135 may manage data communication between the processor 120 and the peripheral component(s) 13, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that may provide information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. In some cases, memory device may include one or more comparators with may be coupled to or included in a device (e.g., the external memory controller 105 or the memory device 110) and used by the device to compare error detection information (e.g., checksums) to identify errors in data communicated within system 100.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are further described with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-*a*, memory die 160-*b*, and/or any quantity of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs, increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105.

For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. Although the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165.

In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may, in some cases, be performed by the external memory controller 105 (either separate from or as included in the processor 120). In some examples, the external memory controller 105 may be configured to receive, from the memory device 110, an indication of an error in data transmitted to the memory device 110. For instance, the external memory controller 105 may receive a bit having a binary value indicating that there was an error in data received at the memory device 110. As such, the external memory controller may determine, based on the received indication, to retransmit the data included the error.

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 192 may be x4 (e.g., including four signal paths), x8 (e.g., including eight signal paths), x16 (including sixteen signal paths), etc. In some examples, the channels 115 may correspond to physical lines (e.g., conductive lines). For instance, signaling communicated between devices may be carried by a channel 115 over one or more conductive lines located within system 100.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to adjust (e.g., oscillate) between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly.

In some cases, the clock signal may be single ended. In some cases, the clock signal may be a 1.5 GHz signal. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (e.g., DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any quantity of signal paths. In some cases, the other channels 192 may include one or more write clock signal (WCK) channels. Although the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations).

Accordingly, the write clock signal WCK may also be referred to as a data clock signal WCK. The WCK channels may be configured to communicate a common data clock signal between the external memory controller 105 and the memory device 110. The data clock signal may be configured coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some cases, the other channels 192 may include one or more EDC channels. An EDC channel may be configured for multiple functions, such as error correction during read and write operations and feedback related to timing shifts in the memory device 110 during read operations. For example, an EDC line may be used to return a checksum (e.g., a cyclic redundancy check (CRC) checksum) for data written to the memory device 110. In such cases, an 8-bit checksum may be generated by the memory device 110 for eight (8) data bits received over one or more data channels 190 (or data lines). In other cases, data received on multiple data channels 190 or during one or more data bursts may be combined when generating a checksum.

In any event, the memory device 110 may provide the generated checksum to the external memory controller 105 (e.g., a GPU) via an EDC pin. The external memory controller 105 may likewise generate a checksum for the transmitted data and, based on a comparison between the checksums, determine whether the data was correctly received at the memory device 110. If an error is detected, any data that included the error may be retransmitted to the memory device 110 to rewrite information related to the error.

In cases when there is no checksum data to be provided to the external memory controller 105, the EDC line may alternatively be used to communicate a timing signal (e.g., a clock-like pattern) to the external memory controller 105 for tracking of the timing of the memory device 110. Such clock-like patterns may comprise a hold pattern (e.g., an EDC hold pattern) driven by EDC signaling and defined by one or more mode register settings (e.g., a quantity of bits in a mode register may define the hold pattern). A hold pattern may comprise some quantity of bits (e.g., four (4) bits) that may be transmitted repeatedly/continuously by the memory device 110 for clock and data recovery operations.

In some cases, the timing of the memory device 110 may be affected by changes in temperature or supply voltage, among other parameters, which may result in variations in the operation of the memory device 110 (e.g., increased voltage noise (such as caused by thermal agitation of charge carriers), temperature-induced jitter). As a result, the clock-like pattern or clock signal of the memory device 110 may drift with changes in the temperature and/or supply voltage, causing shifts in a data eye position away from a trained (e.g., optimum) data eye position, potentially increasing the probability of transmission errors.

In such cases, based on the clock signal sent (e.g., via an EDC channel), the external memory controller 105 may determine whether retraining is needed to account for shifts in the timing of the memory device 110, or whether a timing offset on, for example, the read data received from the memory device 110 needs to be applied. Accordingly, the clock-like pattern sent by the memory device 110 via the EDC pin may enable the external memory controller 105 to identify and adapt to variations in memory timing and other conditions.

EDC signals from a memory device 110, however, may interfere with relatively weaker data signals from the external memory controller 105 close to a receiver of the memory device 110. For instance, the EDC line may be located between or near one or more data lines (e.g., corresponding to data channel 190). When checksum information or the clock-like pattern is transmitted on an EDC line that runs against (in the opposite direction of) data transmitted on one or more data lines, crosstalk may affect the data received at the memory device 110.

As an example, gapless write cycles may use continuous data transfer from the EDC line in the opposite direction to the one or more data lines (e.g., and at the same rate as the data is transmitted). If the EDC line drives signaling out of the memory device 110 at the same time or concurrent with data being latched in the memory device 110 (or at nearly the same time), interference (e.g., near-end crosstalk, also referred to as backward crosstalk) may occur on one or more data channels.

Crosstalk may be referred to as a signal that inadvertently affects other signals (e.g., nearby signals) within a system through electromagnetic effects, and may correspond to the coupling of one signal with another signal (e.g., where two or more signals may be coupled such that changes in one signal may unintendedly affect and be observed in another signal). The coupling may comprise capacitive, inductive, and/or conductive coupling between signals, and also may include substrate coupling of signals (e.g., the coupling of signals via a substrate of an integrated circuit). Additionally, crosstalk may be described in terms of an "aggressor" signal affecting a "victim" signal, where the "victim" signal may, for example, be a weaker signal (e.g., lower power) of the two. Crosstalk may occur in some systems that use high-frequency transmissions, and crosstalk may introduce unwanted interference into the system 100, degrading the quality and efficiency of transmitted information.

In some cases, crosstalk caused by EDC signaling may result in a compromise between using the EDC line with crosstalk and avoiding use of the EDC line altogether. For instance, the transmission of checksum information may disrupt a system to the point where it may be more efficient to perform periodic retraining (e.g., every 300 microseconds (µs)) instead of using the EDC line for error correction and timing tracking. As such, the negative effects of crosstalk from EDC signaling may be so great that periodic retraining (and any associated loss in efficiency) may be more advantageous than operating without error detection capabilities (e.g., when use of EDC pin is avoided entirely). In this case, the external memory controller 105 may perform one or more actions (e.g., a sequence of steps) to synchronize the clocks of the external memory controller 105 and the memory device 110 and may further determine data eye positions for the inputs and outputs of the memory device 110. For example, the retraining may include the modification of delays in clock signals sent over the CK channel 188 to align the respective clocks and identify latencies associated with one or more read and/or write operations. This may, in some cases, be followed by the signaling of various commands to the memory device 110 to determine data eye positions.

System 100 may support techniques for reducing or eliminating crosstalk between different channels 115, such as described herein with reference to signaling transmitted via an EDC channel. As an example, the memory device 110 may detect errors in received data and transmit an indication of the error when detected, thereby reducing the frequency of error detection feedback from the memory device 110. In such cases, error detection processes may be performed at the memory device 110 instead of the external memory controller 105.

For instance, the memory device may receive data over the data channel 190, and may also receive checksum information for the data via the EDC channel. In such cases, the data and checksum information may be transmitted from the external memory controller 105 to the memory device 110 at the same time (e.g., concurrently) and in the same direction (e.g., from one device to the other). The memory device 110 may accordingly generate a checksum for the received data and detect transmission errors, for example, by comparing the generated checksum and the checksum information received from the external memory controller 105. The memory device 110 may then transmit an indication of detected errors in received data to the external memory controller 105, and the indication (e.g., a single bit) may be transmitted using a line that is different than the EDC line.

In some cases, a low-speed tracking clock signal may additionally or alternatively be transmitted by the memory device 110 over a line different than the EDC line. For instance, to avoid use of signaling on the EDC line against received data, the memory device 110 may transmit a clock signal or clock-like pattern on a different line located away from the data lines to eliminate crosstalk on one or more nearby data lines. A reduced rate of the clock-like pattern (e.g., as compared to a data transfer rate of the system 100) may further decrease crosstalk in the system 100. Further, the low-speed tracking clock signal may be a low-voltage differential signal that enables further reduction of crosstalk in system 100.

Additionally or alternatively, the memory device 110 may transmit a generated checksum to the external memory controller 105 with a time offset applied to the checksum signaled over the EDC line. For example, EDC signaling may be delayed to provide an offset between edges transmitted on the data lines and the EDC line. The particular offset in the EDC signaling may be selected from a set of offsets that may be determined (e.g., calculated) based on operating conditions at the memory device 110.

The described techniques to reduce crosstalk in system 100 may be used separately, or in combination, or both at different times. For example, transmitting a low-speed clock signal over a line different than the EDC line may be advantageous in some circumstances, while reducing the swing of or adding a timing offset to EDC signaling may be preferable in others. Implementation of the described solutions may save resources (e.g., printed circuit board (PCB) space) by using one or more of the described solutions, where circuitry for one or more of these techniques may be included on a PCB.

Figure 2:
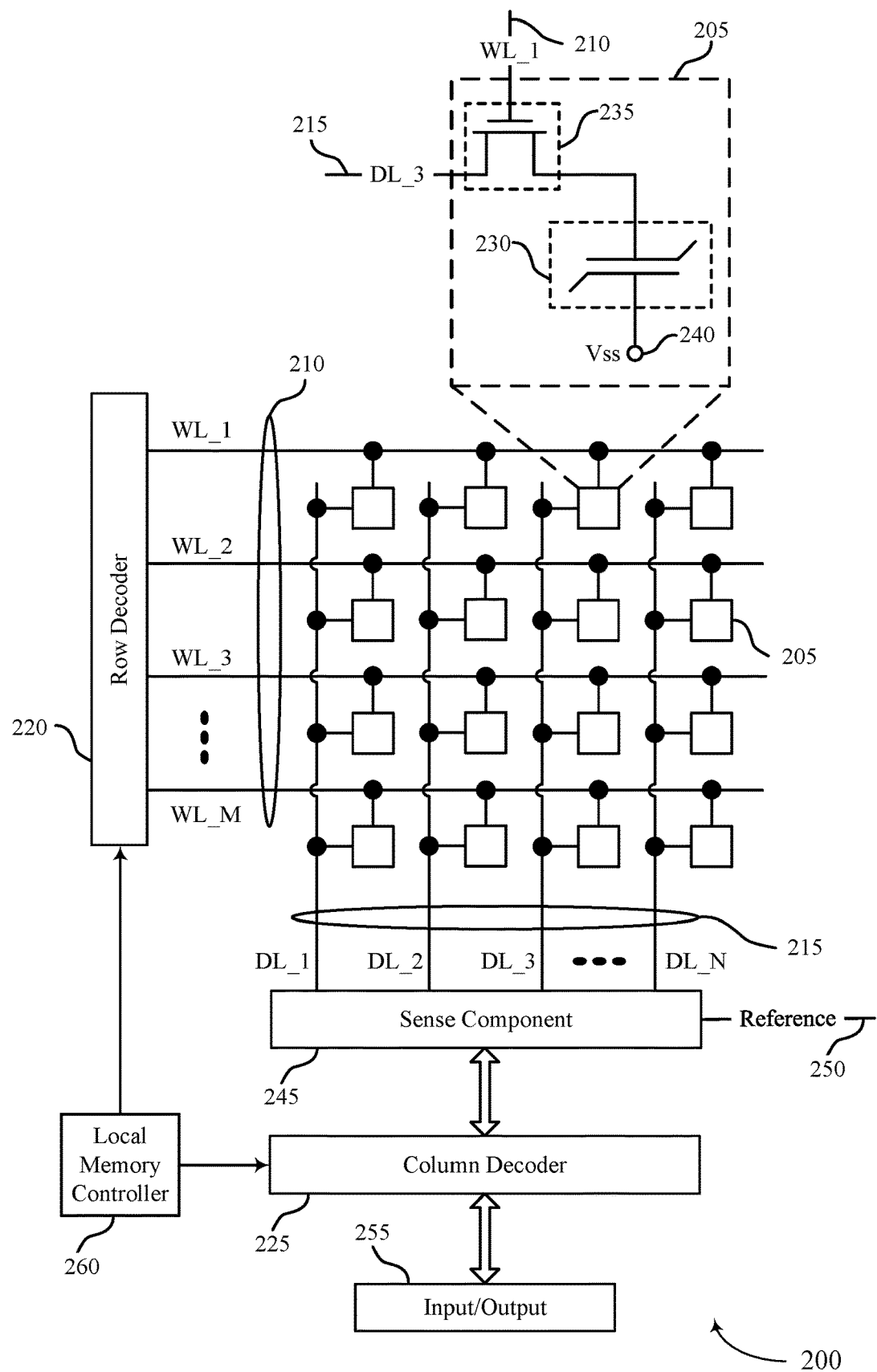
FIG. 2 shows a block diagram of a device that supports transmission failure feedback schemes for reducing crosstalk in accordance with examples as disclosed herein.

FIG. 2 illustrates an example of a memory die 200 that supports transmission failure feedback schemes for reducing crosstalk in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 is a ground such as Vss. In some cases, the voltage source 240 may be an example of a plate line coupled with a plate line driver. The switching component 235 may be an example of a transistor or any other type of switch device that selectively establishes or ceases electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change.

The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations.

The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some examples, the local memory controller 260 may detect errors in data received, for example, during an access operation such as a write operation. For instance, the local memory controller may compare checksum information for data to be written to memory cells 205, where a checksum associated with the data may be generated by the local memory controller 260, and may be compared to a checksum generated before the data was transmitted (e.g., as provided by another device). Based on the comparison, errors may be detected in cases where the respective checksums are different, indicating that the data received is different than the data that was transmitted. In the event that errors are detected in received data, the local memory controller 260 may transmit an indication to the other device to indicate the error, which may trigger the retransmission of the data. In other cases, there may be no errors detected through the checksum comparison (e.g., the checksums are the same), and the local memory controller 260 may proceed with the access operation using the received data.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined.

In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205).

The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

The memory die 200 illustrates a two-dimensional (2D) array of memory cells. In some cases, the memory device may include three-dimensional (3D) arrays or memory cells. A 3D memory array may include two or more 2D memory arrays stacked on top of one another. In some cases, 2D memory arrays in a 3D memory array may be referred to as decks, levels, layers, or dies. A 3D memory array may include any quantity of stacked 2D memory arrays (e.g., two high, three high, four high, five high, six high, seven high, eight high). This may increase the quantity of memory cells that may be positioned on a single die or substrate as compared with a single 2D memory array, which in turn may reduce production costs or increase the performance of the memory array, or both. In some 3D memory arrays, different decks may share at least one common access line such that some decks may share at least one of a word line 210 or a digit line 215.

Figure 3:
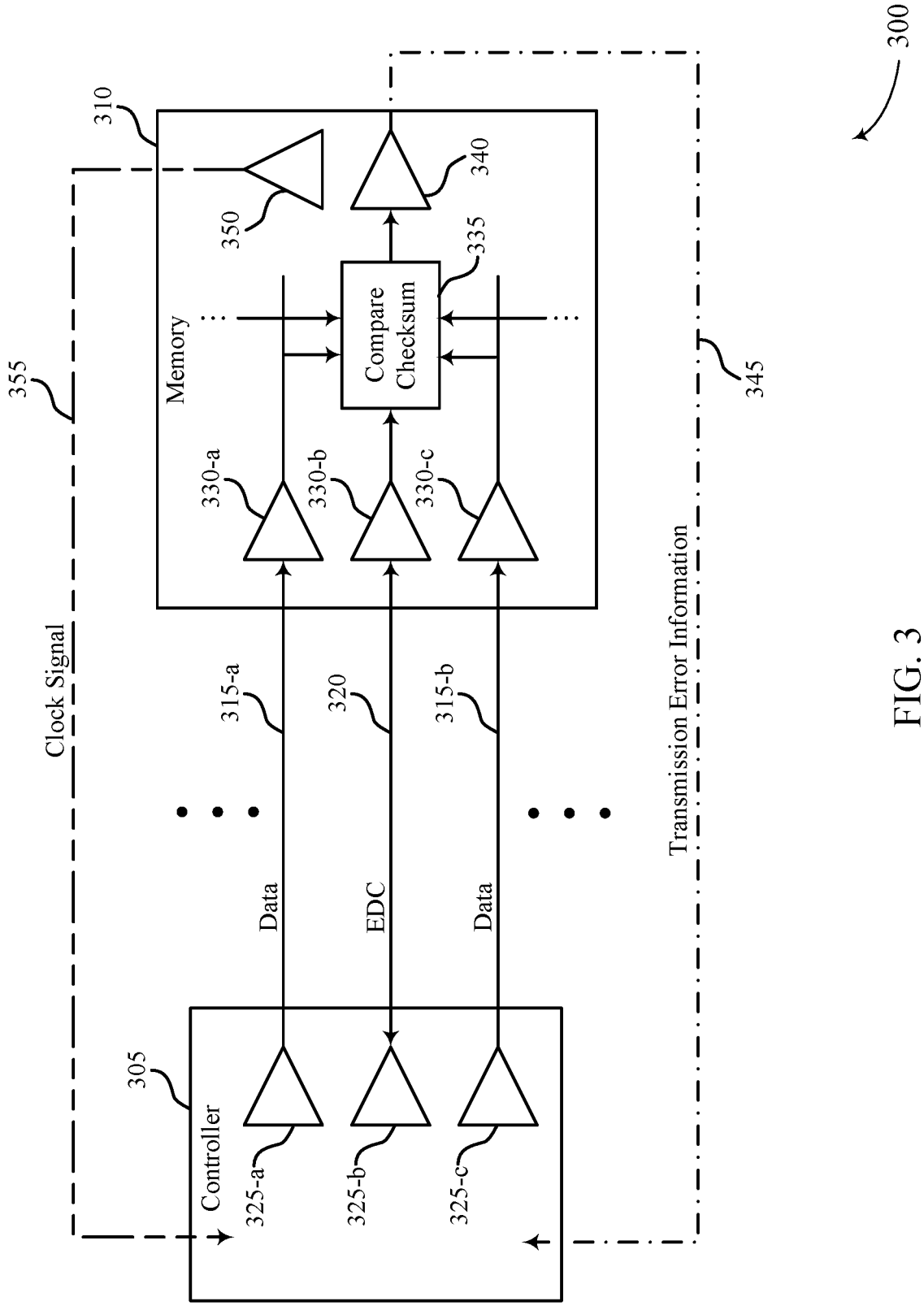
FIG. 3 illustrates an example of a system that supports transmission failure feedback schemes for reducing crosstalk in accordance with examples as disclosed herein.

FIG. 3 illustrates an example of a system 300 that support transmission failure feedback schemes for reducing crosstalk in accordance with examples as disclosed herein. The system 300 may include a controller 305 and a memory device 310, each of which may implement aspects of the described techniques. For example, controller 305 may be an example of an external memory controller 105 (e.g., a GPU, a GPGPU, a CPU, etc.), as described herein with reference to FIG. 1. Additionally, memory device 310 may be an example of a memory device 110 (e.g., a graphics double data rate (GDDR) memory device) as described with reference to FIGS. 1 and 2.

The controller 305 and the memory device 310 are shown in the example of system 300 as coupled with one another via multiple lines (e.g., data lines 315-a and 315-b, as well as EDC line 320), where each line may correspond to a channel 115, as described with reference to FIG. 1. It is to be understood that the controller 305 and the memory device 310 may be coupled with one another and may exchange signals via any quantity of lines.

For instance, the controller 305 and the memory device 310 may be coupled via one data line 315 or coupled via multiple data lines 315 (e.g., located above data line 315-a and/or below data line 315-b, as depicted in FIG. 3). Each of the data lines 315 and the EDC line 320 may be unidirectional or multidirectional lines used for communicating between the controller 305 and the memory device 310.

In some cases, the data lines 315-a and 315-b may be examples of conductive lines that correspond to a data channel (e.g., a data channel 190, as described with reference to FIG. 1), and the EDC line 320 may correspond to an EDC channel as described with reference to FIG. 1. As such, the controller 305 may drive or transmit signals on each of the data lines 315 using one or more transmitters 325. For example, a first transmitter 325-a, or another transmitter 325-c, or both, may be configured to transmit data to be written to an array of memory cells (such as a memory array 170 described with reference to FIG. 1) at memory device 310.

Additionally, the controller 305 may include a second transmitter 325-b configured to transmit information on the EDC line 320. Memory device 310 may include one or more receivers 330 (e.g., receivers 330-a through 330-c) configured to receive signals transmitted by the controller 305. As illustrated, EDC line 320 may be located between data line 315-a and data line 315-b. As such, signaling sent from the memory device 310 to the controller 305 via the EDC line 320 may result in crosstalk on one or more data lines 315 (e.g., data line 315-a, or data line 315-b, or other data line(s) 315 not shown, or any combination thereof).

In some aspects, system 300 may implement techniques that reduce or eliminate crosstalk from the EDC line 320 to the data lines 315. For example, the controller 305 may provide checksum information (e.g., a CRC checksum) for data sent via one or more data lines 315 (e.g., for write operations from the controller 305 to a memory device 310). That is, the controller 305 may perform a checksum calculation on data to be transmitted, and may provide the checksum information together with the data. The checksum information may be sent via the EDC line 320 to the memory device 310. In such cases, signaling on the EDC line 320 (from the controller 305 to the memory device 310) may be aligned in time with the data sent on the data line(s) 315. As a result, the signaling being sent in the same direction as the data may provide for reduced crosstalk at the memory device 310 and, consequently, fewer errors in data to be written to an array of memory cells.

Further, the memory device 310 may generate a checksum for received data, and may identify errors in the received data. That is, a checksum comparison may be performed directly by the memory device 310. In some cases, the memory device 310 may include a comparator 335 used to compare a checksum for the received data with the checksum received from the controller 305.

In the event of an identified failure in the received data, the memory device 310 may transmit an indication to the controller 305 to request a re-write of the data having the error (e.g., failed data). In some examples, the indication of failed data may be transmitted by the memory device 310 using the EDC line 320. Additionally or alternatively, the memory device 310 may include a transmitter 340 that receives an indication of failed data (e.g., from the comparator 335), and may in turn send information relating to the transmission failure to the controller 305 (e.g., via an error feedback line 345). For instance, the error feedback line may comprise an additional signal line on the die or substrate separate from the EDC line 320, and may be configured for (e.g., dedicated to) the transmission of error feedback information (e.g., transmission error information). In some examples, the error feedback line 345 may be a joint test action group (JTAG) signal line or another line different than the EDC line.

In some examples, the transmission failure information may comprise a single bit having a binary value (e.g., a 0 or 1) that serves as a flag that data received from the controller 305 has failed (e.g., the compared checksums were different). The single data bit may verify (or correspond to) a completed write process, which may eliminate per-byte or per-bit information fed back to the controller 305 (e.g., because rewrite operations may rewrite an entire data burst) and therefore reduce crosstalk for signaling sent via the EDC line 320. The indication transmitted with the transmission error information may, in some examples, be transmitted less frequently compared to continuous checksum transmissions from the memory device 310 to the controller 305.

In some cases, the quantity of errors may be relatively low (e.g., due in part to the reduction of return signaling from the memory device 310), and any crosstalk that may be caused by infrequent return signaling (using the EDC line 320, or the error feedback line 345, or both) may accordingly be minimized. In some aspects, the binary indication may provide feedback (e.g., continual feedback) to the controller 305 as to whether transmitted data was correctly received, which may enable the controller 305 to monitor the status of data sent to the memory device 310.

Additionally or alternatively, a low-density (e.g., low-frequency) clock signal may be used for feedback of timing tracking between the memory device 310 and the controller 305. In such cases, a clock 350 may transmit the clock signal to the controller 305 using a timing feedback line 355 that is different than the EDC line 320. In such cases, the frequency (e.g., quantity of edges) of the clock signal driven by the clock 350 may be less than a frequency of clock signals or a clock-like pattern transmitted via the EDC line 320. For instance, the frequency of the clock signal may be reduced (e.g., by a factor of 10), resulting in fewer edges transmitted from the memory device 310 to the controller 305, and thus reducing crosstalk in the system 300. In some cases, the clock signal may comprise a hold pattern (e.g., a clock-like signal) of a quantity of bits repeated by the memory device 310 (e.g., used to provide feedback of the timing of the memory device 310).

In some cases, the clock signal driven by the clock 350 may be a differential signal with a low voltage swing (e.g., as compared to the voltage swing of other signals transmitted within the system 300). For example, the clock signal may be a low-swing differential clock signal (e.g., in accordance with an industry standard or specification such as a Joint Electron Device Engineering Council (JEDEC) standard or a low voltage differential signaling (LVDS) standard) that may have a low voltage swing (e.g., a difference between a maximum output voltage and minimum output voltage) that operates at low power, runs at high speeds, and transmits information using a difference between voltages on a pair of wires or lines. Such signals may use a fraction of the voltage swing of other signals used within the system, yet may still enable high data rates and low power consumption. As such, by reducing the voltage swing of the clock signal, or reducing the quantity of edges for the tracking clock signal from the memory device 310, or transmitting the signal on the timing feedback line 355, or any combination thereof, crosstalk may be reduced within the system 300.

In some cases, any combination of lines may be used by the memory device 310 when sending transmission error information, or the clock signal, or both. For example, respective lines (e.g., both error feedback line 345 and timing feedback line 355) may be used for the respective signals sent by the memory device 310, as shown in system 300. In such examples, the separate lines may be driven at different speeds, or the signals sent on the respective lines may be different, or a combination thereof. For example, errors in received data may occur less frequently than the clock signal driven by clock 350, and the clock signal may be sent on timing feedback line 355 with a lower voltage swing compared to the transmission error information sent on error feedback line 345. In other examples, various lines may be used independently or dynamically to switch between different functionalities and feedback schemes. In such cases, the memory device 310 may use the error feedback line 345, or the timing feedback line, or the EDC line 320, or any combination thereof, for transmitting information to controller 305 based on one or more conditions.

Additionally or alternatively, a single line different than the EDC line 320 may be used for transmission of the low-speed clock and error feedback reporting. That is, different types of information may be sent using the same signal. In such cases, different encoding/decoding schemes may be applied to each type of information. For example, a clock signal may use a first type of encoding, and if a failure in received data is detected, a different encoding (e.g., a longer 0 phase or longer 1 phase) may be used for the transmission error information such that the controller 305 may identify the difference between changes in the clock signal and the indication of an error in received data. Thus, error feedback information may be embedded into a low-speed clock signal, and the controller 305 may perform decoding of the different types of signals according to a decoding scheme.

Figure 4:
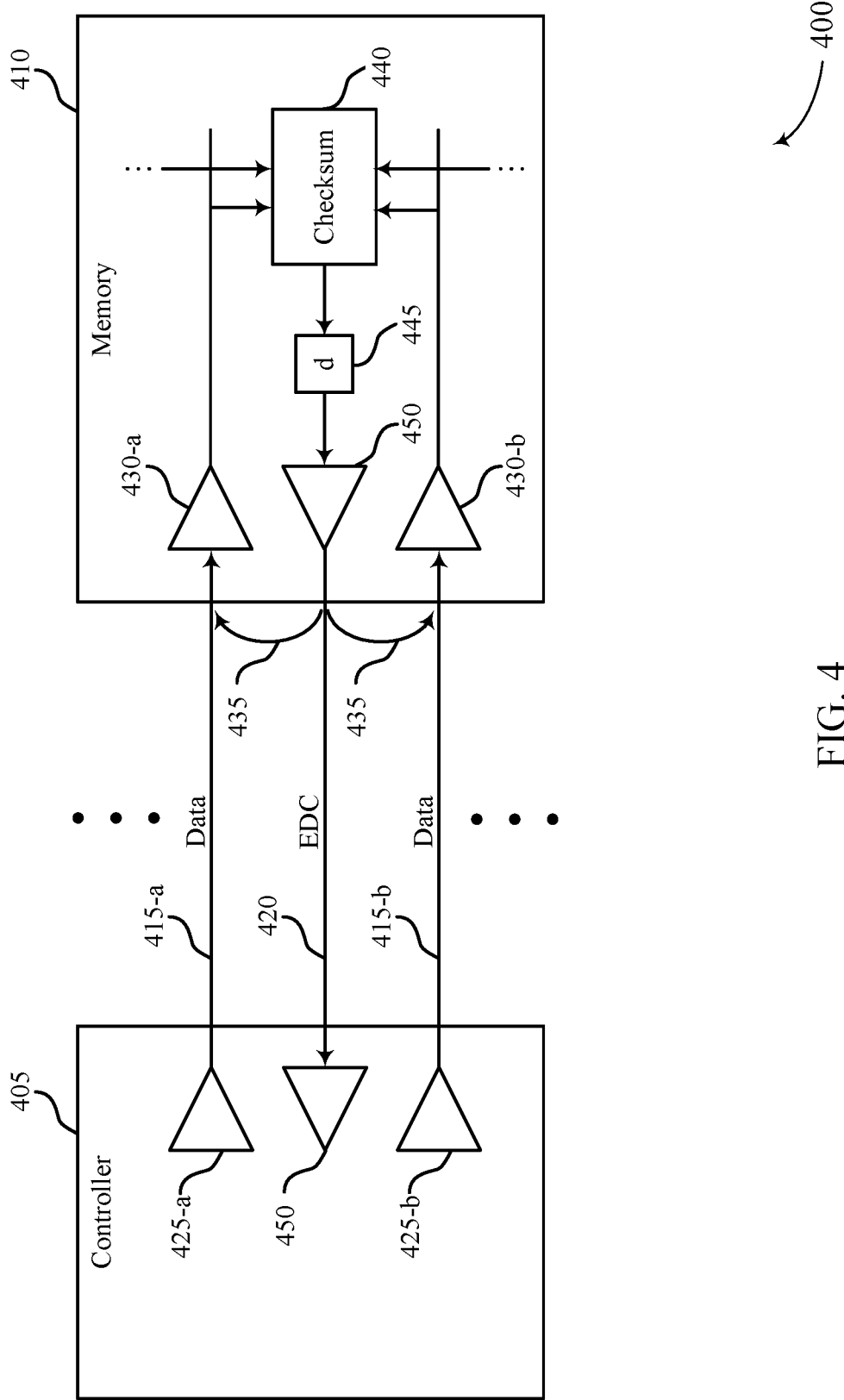
FIG. 4 illustrates an example of a system that supports transmission failure feedback schemes for reducing crosstalk in accordance with examples as disclosed herein.

FIG. 4 illustrates an example of a system 400 that support transmission failure feedback schemes for reducing crosstalk in accordance with examples as disclosed herein. The system 400 may include a controller 405 and a memory device 410, each of which may implement aspects of the described techniques. For example, controller 405 may be an example of an external memory controller 105 (e.g., a GPU), as described herein with reference to FIG. 1. Additionally, memory device 410 may be an example of a memory device 110 (e.g., a GDDR memory device) as described with reference to FIGS. 1 through 3.

The controller 405 and the memory device 410 are shown in the example of system 400 as coupled with one another via multiple lines (e.g., data lines 415-a and 415-b, as well as EDC line 420), where each line may be or correspond to a channel 115, as described with reference to FIG. 1. But it is to be understood that the controller 405 and the memory device 410 may be coupled with one another and may exchange signals via any quantity of lines or channels 115. For instance, the controller 405 and the memory device 410 may be coupled via one data line 415 or coupled via multiple data lines 415 (e.g., located above data line 415-a and/or below data line 415-b, as depicted in FIG. 4).

Each of the data lines 415 and the EDC line 420 may be unidirectional or multidirectional lines used for communicating between the controller 405 and the memory device 410. In some cases, the data lines 415-a and 415-b may be or correspond to a data channel (e.g., a data channel 190, as described with reference to FIG. 1), and the EDC line 420 may be or correspond to an EDC channel as described with reference to FIG. 1. As such, the controller 405 may drive or transmit signals on each of the data lines 415 using one or more transmitters 425.

For example, a first transmitter 425-a, or a second transmitter 425-b, or both, may be configured to transmit data to be written to an array of memory cells (not shown) at memory device 410. Memory device 410 may include one or more receivers 430 (e.g., including a first receiver 430-a and a second receiver 430-b) configured to receive signals transmitted by the controller 405. As illustrated, EDC line 420 may be located between data line 415-a and data line 415-b. As such, signaling sent from the memory device 410 to the controller 405 via the EDC line 420 may result in crosstalk on one or more data lines 415 (e.g., data line 415-a, or data line 415-b, or another data line 415 not shown, or any combination thereof).

In some cases, system 400 may implement techniques that reduce or eliminate crosstalk 435 from the EDC line 420 to the data lines 415. For instance, memory device 410 may temporally shift an aggressor signal (e.g., transmitted via the EDC line 420) versus victim signals (e.g., on neighbored data lines) to decrease crosstalk in the system 400. For instance, a timing offset (or programmable delay) may be added to an EDC feedback path (corresponding to an EDC pin) from the memory device 410 to the controller 405. The timing offset on the EDC path may move or adjust the edges of EDC signals with respect to the edges of signals received via the data lines 415.

Accordingly, the timing offset may adjust the timing of EDC signaling from the memory device 410 (e.g., checksum information, transmission error information, a timing signal, a clock-like pattern) such that crosstalk 435 experienced on the data lines 415-a and 415-b may be minimized and a data eye may be correspondingly optimized. In particular, by offsetting the edges of data signals sent on the data lines 415 and edges of information sent on the EDC line 420, coupling between these two signals may be minimized, thereby minimizing interference from crosstalk 435.

As an illustrative example, the memory device 410 may compute a checksum 440 using data received on one or more data lines 415. The checksum may then have a timing offset 445 (or programmable delay (d)) applied prior to transmission. For instance, the time offset may be introduced into the signal using one or more inverters. It is understood, however, that any method for introducing a delay into the transmission path may be used. The offset signal (e.g., the signal having a timing offset applied) may then be transmitted, using a transmitter 450, to the controller 405 via EDC line 420.

In some cases, the timing offset applied to the EDC signaling may be selected from a set predefined timing offsets. For example, the memory device 410 may support multiple timing offsets that may be applied to EDC signals, and the various timing offset may be stored by a mode register at the memory device 410. In such cases, one or more mode registers used by the memory device 410 may define different timing offsets, and different delay steps or offsets may be available to choose from, which may, for example, select (e.g., add) or deselect (e.g., remove) inverters from the transmission path to apply the desired delay. That is, the transmission path may have a set of inverters that may be dynamically selected to enable programmable delays in signaling. As a result, the timing of EDC signaling may be shifted in time relative to the timing of data transmissions on the one or more data lines 415.

The predefined timing offsets may be configured based on various conditions at the memory device 410. For instance, various EDC output timings may be configured to achieve a lowest crosstalk 435 from EDC signals (and a corresponding largest data eye) based on particular sets of conditions of the memory device 410.

For instance, timing offsets may be configured based on a speed (e.g., an operating speed, a clock speed) with which the system 400 is running, or a temperature at which the system 400 is running, etc. In some cases, a quantity of capabilities may be stored in mode register (e.g., driver strength of an off-chip driver (OCD), termination offset), which may be adjusted based on various conditions at the memory device 410, and these capabilities may be modified to find a timing offset that minimizes crosstalk. In some examples, the predefined timing offset may be stored in BIOS, and may be loaded into the mode register upon system startup. Thus, when the system 400 is booted, driver strengths and termination offsets may be identified, and a preferred timing offset may be selected from the mode register based on these parameters, among others, and used to minimize crosstalk 435.

Figure 5:
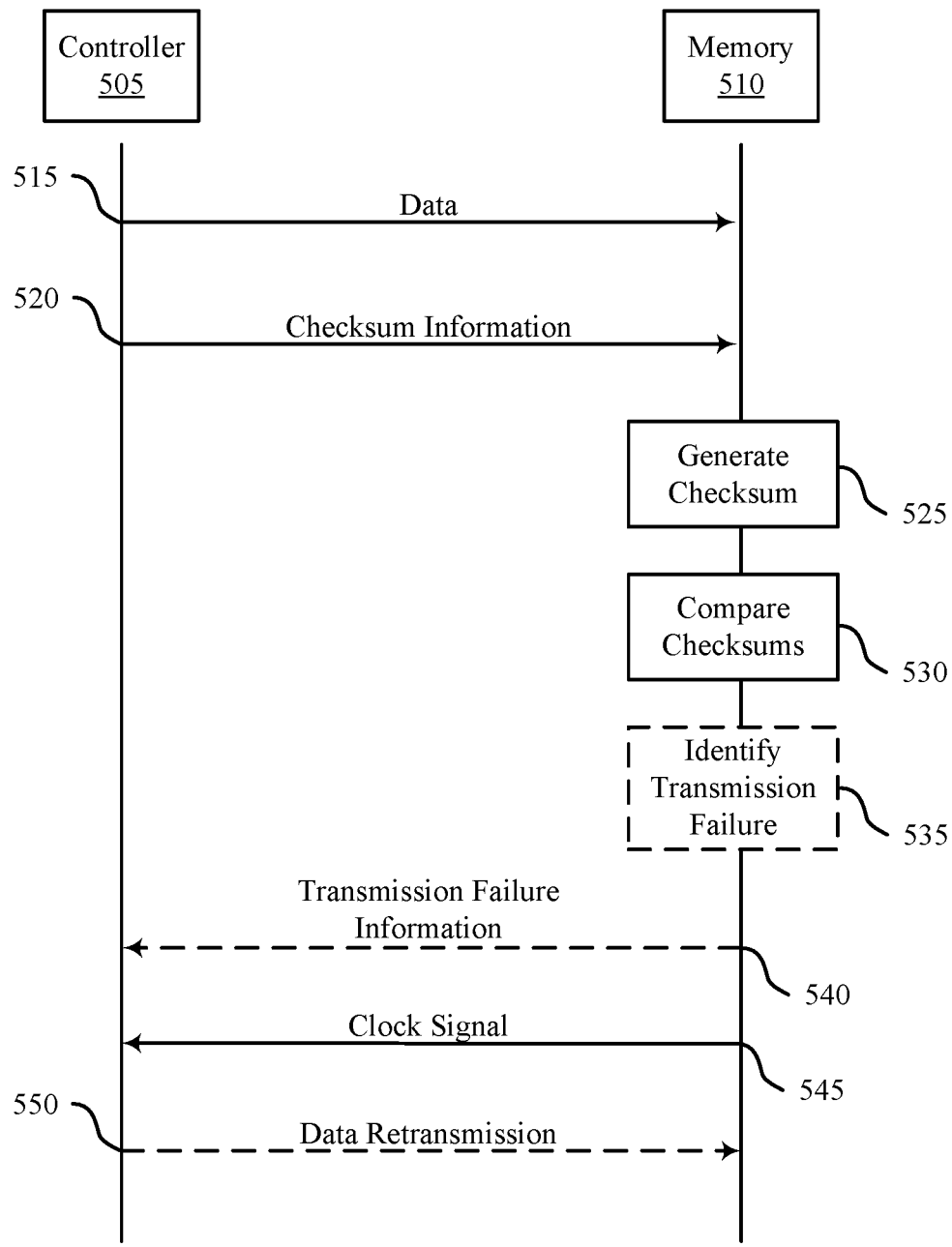
FIG. 5 illustrates a process flow in a system that supports transmission failure feedback schemes for reducing crosstalk in accordance with examples as disclosed herein.

FIG. 5 illustrates a process flow 500 that supports transmission failure feedback schemes for reducing crosstalk in accordance with examples as disclosed herein. In some examples, aspects of process flow 500 may be implemented by a controller 505 and a memory device 510, which may be examples of the corresponding devices described with reference to FIGS. 1-4. For instance, the controller 505 may be an example of an external memory controller 105 (e.g., a GPU) described with reference to FIG. 1. Additionally, the memory device 510 may be an example of a memory device 110 described with reference to FIG. 1. Process flow 500 may illustrate the use of one or more channels that are different than an EDC channel for transmitting EDC feedback information to the controller 505.

For example, at 515, the controller 505 may transmit, and memory device 510 may receive, data to be written to an array of memory cells over one or more data channels (e.g., corresponding to data lines) coupled with the memory device 510. In some cases, the data may be transmitted over a common data channel coupling the controller 505 and the memory device 510. In some examples, the one or more data channels may be an example of the data channel 190 described herein and may be unidirectional or bidirectional data channels.

At 520, the controller 505 may transmit, and memory device 510 may receive, checksum information for the transmitted data. In some cases, the checksum information may be transmitted over an EDC channel (e.g., corresponding to a data line) coupled with the memory device 510.

At 525, the memory device 510 may generate a checksum for the data received over each data channel of the one or more data channels. For example, the memory device 510 may generate the checksum through the division of a set of bits representing the received data and a set of bits representing a generator polynomial, where a remainder of the operation may comprise the checksum. In some cases, the checksum may be generated using software or hardware.

At 530, the memory device 510 may compare the generated checksum for the received data and the received checksum information. In some cases, due to techniques implemented in the system to reduce crosstalk through a reduction or modification in feedback signaling by the memory device 510, and as described herein with reference to FIG. 3, errors detected through the comparison may be relatively infrequent. If no errors are detected in the received data, then the data may be written to the array of memory cells at the memory device 510.

In some cases, however, the memory device 510 may detect an error in the data based on the checksum information at 535. For example, detecting the error may be based on the comparison of the generated checksum for the received data and the received checksum information. If the compared checksums are different, then an error in the received data may be identified. Thus, memory device 510 may compute a difference between the generated checksum and the received checksum information based on comparing the respective checksums to identify failures in received data.

At 540, based on detecting the error in the received data, the memory device 510 may transmit transmission failure information indicating the error in the data to the controller 505. In some cases, the transmission failure information may be transmitted over a first channel coupled with the controller 505, where the first channel is different than the EDC channel.

Additionally or alternatively, the transmission failure information may be transmitted over the EDC channel. In cases where the EDC channel is not used, the memory device 510 may refrain from transmitting information to the controller 505 via the EDC channel to further minimize or eliminate crosstalk in the system. In some examples, the indication may include a logic value (e.g., a single bit providing a 1 or 0), and/or may indicate to the controller 505 whether the data transmitted at 515 was successfully received without errors. As an example, a logic value of 1 (or alternatively of 0) may serve as a flag to controller 505 that the data received at the memory device 510 failed.

At 545, the memory device 510 may also transmit a clock signal over a second channel coupled with the controller 505. The second channel may also be different than the EDC channel, and the clock signal may have a different (e.g., lower) frequency than a frequency of the received data. In other words, the clock signal may be a low-speed tracking clock signal (e.g., a low-swing differential signal, or a hold pattern, or both) and may be used by the controller 505 to track the timing of the memory device 510.

In some cases, the clock signal and the transmission failure information may be transmitted over the same channel (e.g., the channel that is different than the EDC channel). In such cases, the clock signal and the transmission failure information may each be modulated differently such that the controller 505 may identify a each type of signal being sent by the memory device 510 based on a modulation used for the clock signal, or the transmission failure information, or both.

At 550, the memory device 510 may receive, from the controller 505, a retransmission of the data to be written to the array of memory cells based on the transmission failure information indicating the error. The memory device 510 may then proceed with writing the data (e.g., to an array of memory cells at the memory device 510) in accordance with an access operation.

Figure 6:
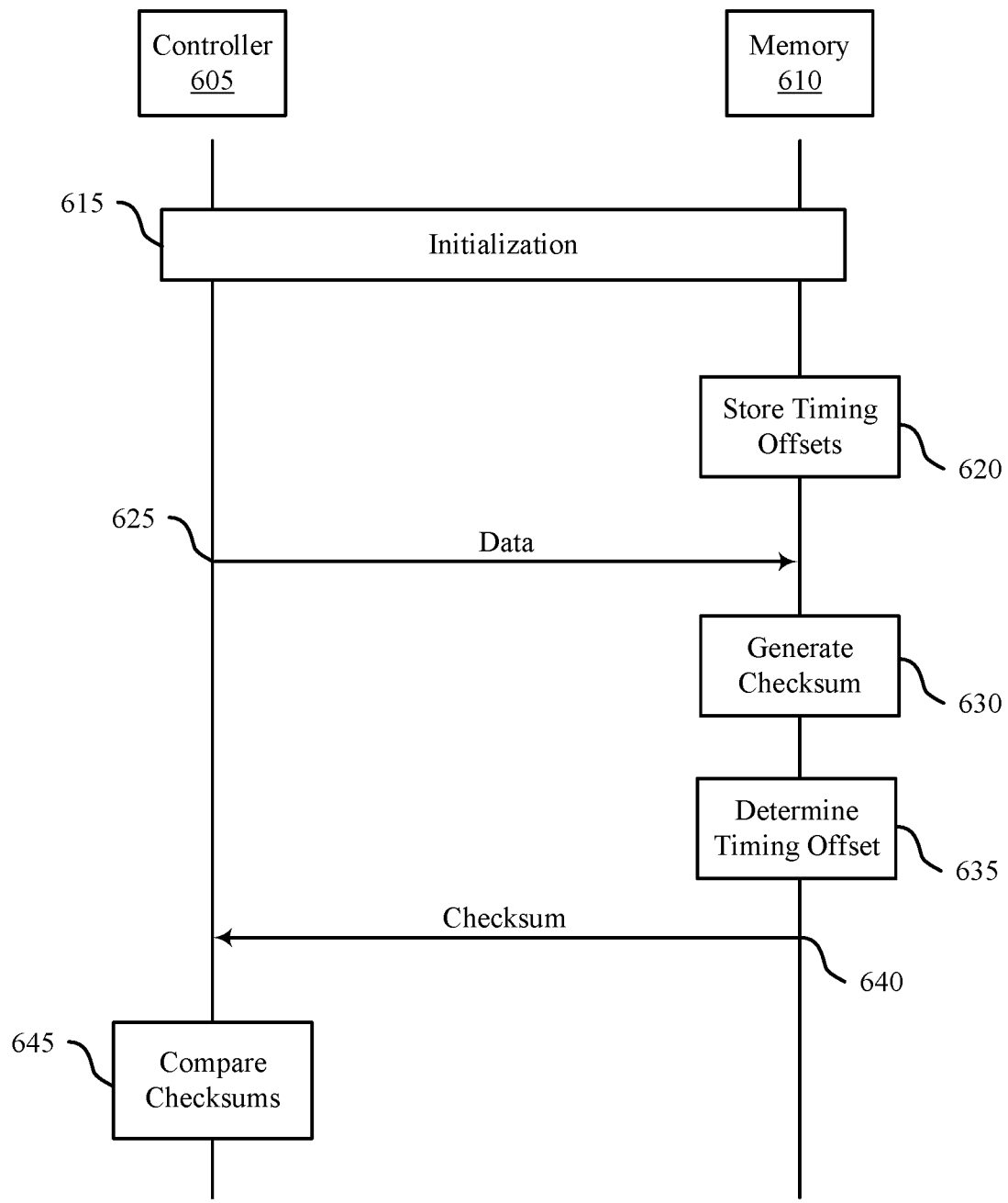
FIGS. 6 through 9 illustrate a method or methods that support transmission failure feedback schemes for reducing crosstalk in accordance with examples as disclosed herein.

FIG. 6 illustrates a process flow 600 that supports transmission failure feedback schemes for reducing crosstalk in accordance with examples as disclosed herein. In some examples, aspects of process flow 600 may be implemented by a controller 605 and a memory device 610, which may be examples of the corresponding devices described with reference to FIGS. 1-5. For instance, the controller 605 may be an example of an external memory controller 105 (e.g., a GPU) described with reference to FIG. 1. Additionally, the memory device 610 may be an example of a memory device 110 described with reference to FIG. 1. Process flow 600 may illustrate the use of a timing offset for signals transmitted via an EDC channel.

At 615, the controller 605 and the memory device 610 may perform an initialization sequence, during which the memory device 610 may receive information that sets one or more preconfigured timing offsets used for transmitting EDC information. At 620, the memory device 610 may store the preconfigured timing offsets in a mode register that is configured by the controller 605.

At 625, the controller 605 may transmit, and the memory device 610 may receive, data to be written to an array of memory cells of a memory device 610, where the data may be received over one or more data channels (e.g., corresponding to data lines). At 630, the memory device 610, may generate a checksum for the data received over each data channel of the one or more of data channels. At 635, the memory device 610 may determine a timing offset for transmitting the generated checksum. In some cases, the timing offset may be selected from the one or more predetermined timing offsets stored, for example, in the mode register at 620.

At 640, the memory device may transmit the checksum at a transmit time that is shifted according to the timing offset. The checksum may be transmitted to the controller 605 over an EDC channel. In such cases, the timing offset (or delay) may be applied to the checksum transmission such that the transmission is shifted with respect to data received from the controller 605. By transmitting the checksum to the controller at the shifted transmission time, crosstalk from the EDC channel onto the data channel(s) may be reduced or minimized.

Based on receiving the checksum information from the memory device 610, the controller 605 may determine whether the data received by the memory device 610 failed by comparing, at 645, the checksum received from the memory device 610 and a checksum generated by the controller 605. In cases where the data received by the memory device 610 has failed, the controller 605 may retransmit the data (e.g., at least a portion of the data that was received with errors) to the memory device 610. Alternatively, if the checksum comparison passes (e.g., the respective checksums are the same) the controller 605 may determine that the data transmitted at 625 was received at the memory device 610 without errors.

Figure 7:
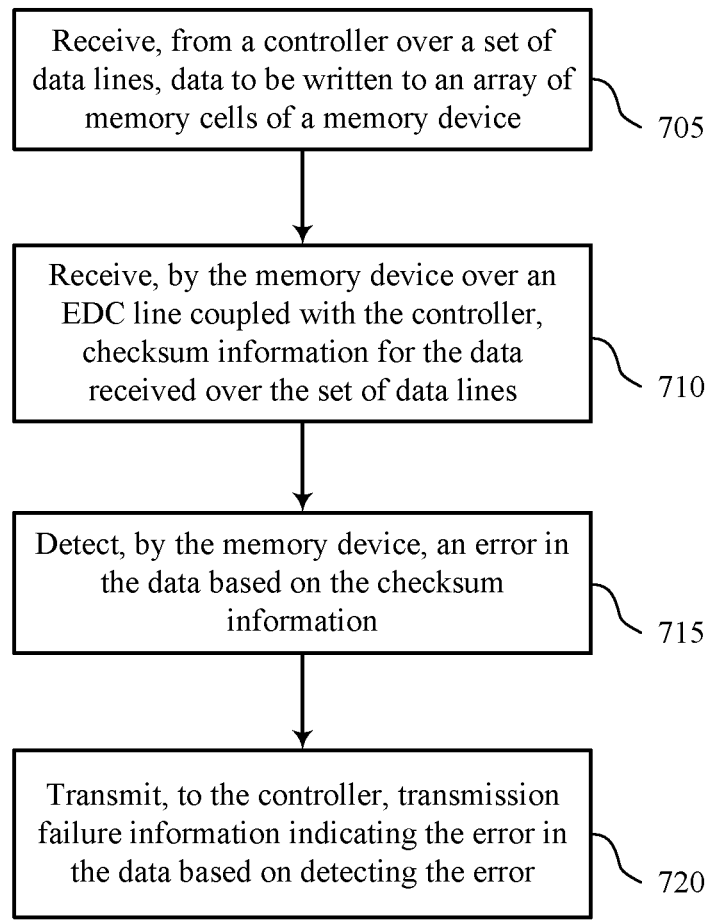

FIG. 7 shows a flowchart illustrating a method 700 that supports transmission failure feedback schemes for reducing crosstalk in accordance with examples as disclosed herein. The operations of method 700 may be implemented by a memory device or its components, as described with reference to FIGS. 1-6. For example, the operations of method 700 may be performed by a memory device 310, as described with reference to FIG. 3. In some examples, the memory device may execute a set of instructions or codes to control the functional elements of the memory device to perform the functions described herein.

At 705 the memory device may receive, from a controller over a set of data lines, data to be written to an array of memory cells of the memory device. In some examples, the data may be received over one data line, or over multiple data lines (e.g., channels), which may correspond to one or more DQ pins. The operations of 705 may be performed according to the methods described with reference to FIGS. 1-6.

At 710 the memory device may receive, over an EDC line coupled with the controller, checksum information for the data received over the plurality of data lines. In some cases, the checksum information may be received simultaneous to the data received from the controller over the set of data lines, or may be received at a different time than the data transmission. In some examples, the checksum information may be a CRC checksum for the data transmitted by the controller, or may be another type of error detecting code calculated by the controller. The operations of 710 may be performed according to the methods described with reference to FIGS. 1-6.

At 715 the memory device may detect an error in the data based on the checksum information. In some cases, the memory device may generate a checksum for the data received on the set of data lines, and may compare the generated checksum with the checksum information received from the controller to detect the error in the received data. The operations of 715 may be performed according to the methods described with reference to FIGS. 1-6.

At 720 the memory device may transmit, to the controller, transmission failure information indicating the error in the data based at least in part on detecting the error in the data. The transmission failure information may provide an indication of whether errors were detected in the data received via the set of data lines. For instance, the indication may comprise a bit value (e.g., 0 or 1) that acts as an indication flag to the controller that an error was detected based on a comparison of checksums. The operations of 720 may be performed according to the methods described with reference to FIGS. 1-6.

In some examples, an apparatus as described herein may perform a method or methods, such as the method 700. The apparatus may include features, means, or instructions (e.g., a non-transitory computer-readable medium storing instructions executable by a processor) for receiving, from a controller over a set of data lines, data to be written to an array of memory cells of a memory device, receiving, by the memory device over an EDC line coupled with the controller, checksum information for the data received over the set of data lines, detecting, by the memory device, an error in the data based on the checksum information, and transmitting, to the controller, transmission failure information indicating the error in the data based on detecting the error.

Some examples of the method 700, apparatuses, and non-transitory computer-readable medium described herein may further include operations, features, means, or instructions for generating a checksum for the data received over each data line of the set of data lines and comparing the generated checksum for the received data and the received checksum information, where detecting the error may be based on comparing the generated checksum for the received data and the received checksum information.

Some examples of the method 700, apparatuses, and non-transitory computer-readable medium described herein may further include operations, features, means, or instructions for determining a difference between the generated checksum and the received checksum information based on comparing the generated checksum and the received checksum information, where detecting the error in the received data may be based on the determined difference between the generated checksum and the received checksum information.

Some examples of the method 700, apparatuses, and non-transitory computer-readable medium described herein may further include operations, features, means, or instructions for transmitting the transmission failure information over a first line coupled with the controller, the first line being different than the EDC line. Some examples of the method 700, apparatuses, and non-transitory computer-readable medium described herein may further include operations, features, means, or instructions for refraining from transmitting a signal to the controller using the EDC line based on the transmission failure information transmitted over the first line.

Some examples of the method 700, apparatuses, and non-transitory computer-readable medium described herein may further include operations, features, means, or instructions for transmitting a clock signal over a second line coupled with the controller, the second line being different than the EDC line, where the clock signal may have a first frequency that may be lower than a second frequency of the received data. In some examples of the method 700, apparatuses, and non-transitory computer-readable medium described herein, the clock signal includes a low-swing differential signal, or a hold pattern, or both.

Some examples of the method 700, apparatuses, and non-transitory computer-readable medium described herein may further include operations, features, means, or instructions for transmitting the transmission failure information over a first line coupled with the controller, the first line being different than the EDC line, where the transmission failure information may be transmitted using a first modulation scheme and transmitting a clock signal over the first line coupled with the controller, where the clock signal may be transmitted using a second modulation scheme different than the first modulation scheme.

In some examples of the method 700, apparatuses, and non-transitory computer-readable medium described herein, the clock signal includes a hold pattern. Some examples of the method 700, apparatuses, and non-transitory computer-readable medium described herein may further include operations, features, means, or instructions for receiving, from the controller, a retransmission of the data to be written to the array of memory cells based on the transmission failure information indicating the error. Some examples of the method 700, apparatuses, and non-transitory computer-readable medium described herein may further include operations, features, means, or instructions for transmitting a logic value that indicates the detected error in the received data.

Figure 8:
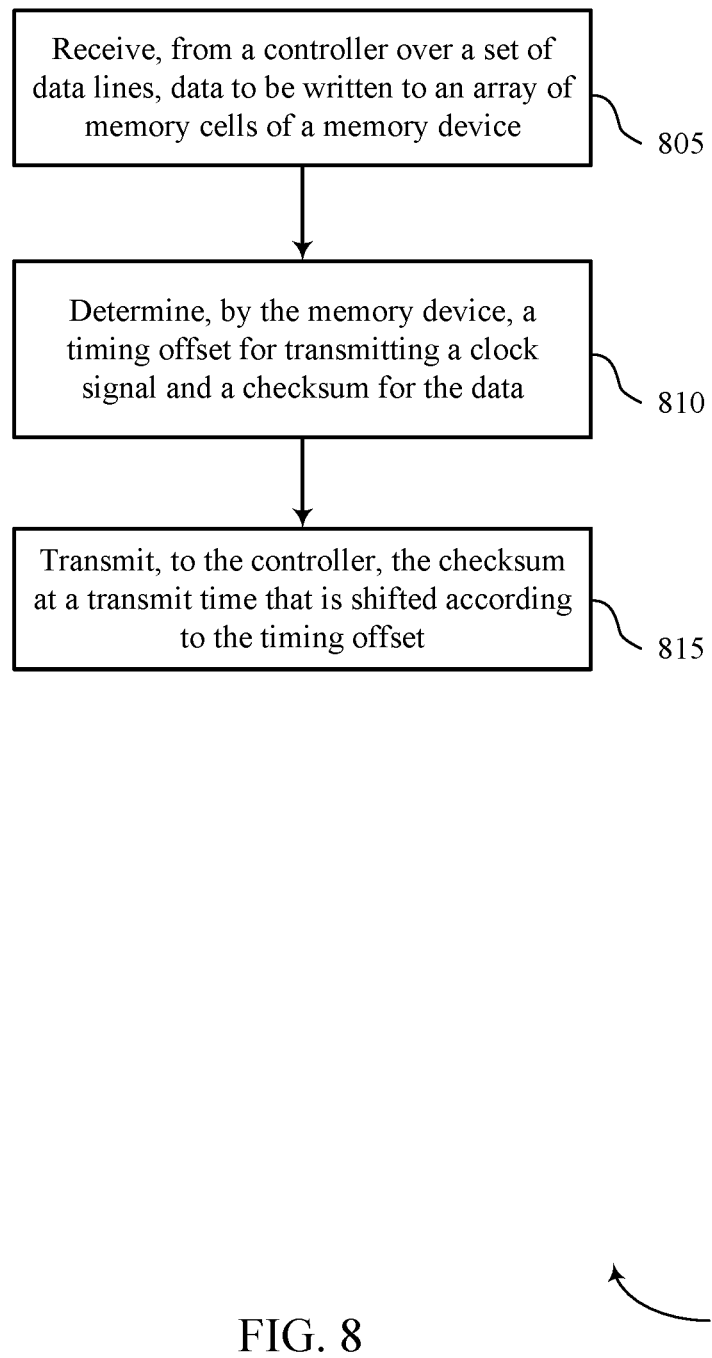

FIG. 8 shows a flowchart illustrating a method 800 that supports transmission failure feedback schemes for reducing crosstalk in accordance with examples as disclosed herein. The operations of method 800 may be implemented by a memory device or its components, as described with reference to FIGS. 1-6. For example, the operations of method 800 may be performed by a memory device 410, as described with reference to FIG. 4. In some examples, the memory device may execute a set of instructions or codes to control the functional elements of the memory device to perform the functions described herein.

At 805 the memory device may receive, from a controller over a set of data lines, data to be written to an array of memory cells of a memory device. In some examples, the data may be received over one data line, or over multiple data lines (or channels) (e.g., corresponding to one or more DQ pins). The operations of 805 may be performed according to the methods described with reference to FIGS. 1-6.

At 810 the memory device may determine a timing offset for transmitting a clock signal (or a clock-like pattern) and a checksum for the data. For instance, the timing offset may be coherently selected for the transmission of the clock signal and/or the checksum based on a timing of the data received at the memory device. As such, the timing offset may shift the transmission timing for the clock signal and/or checksum such that crosstalk is minimized. The operations of 810 may be performed according to the methods described with reference to FIGS. 1-6.

At 815 the memory device may transmit, to the controller, the checksum at a transmit time that is shifted according to the timing offset. That is, the selected timing offset may be applied to a transmit path used for transmitting the checksum. The operations of 815 may be performed according to the methods described with reference to FIGS. 1-6.

In some examples, an apparatus as described herein may perform a method or methods, such as the method 800. The apparatus may include features, means, or instructions (e.g., a non-transitory computer-readable medium storing instructions executable by a processor) for receiving, from a controller over a set of data lines, data to be written to an array of memory cells of a memory device, determining, by the memory device, a timing offset for transmitting a clock signal and a checksum for the data, and transmitting, to the controller, the checksum at a transmit time that is shifted according to the timing offset.

Some examples of the method 800, apparatuses, and non-transitory computer-readable medium described herein may further include operations, features, means, or instructions for selecting the timing offset from one or more preconfigured timing offsets, where each preconfigured timing offset may be based on an operating condition at the memory device.

Some examples of the method 800, apparatuses, and non-transitory computer-readable medium described herein may further include operations, features, means, or instructions for receiving, during an initialization sequence, configuration information setting the one or more preconfigured timing offsets, where selecting the timing offset from the one or more preconfigured timing offsets may be based on the configuration information.

Some examples of the method 800, apparatuses, and non-transitory computer-readable medium described herein may further include operations, features, means, or instructions for storing the one or more preconfigured timing offsets in a mode register that may be configured by the controller. In some examples of the method 800, apparatuses, and non-transitory computer-readable medium described herein, the operating condition includes a data termination state, or a driver strength, or both.

Figure 9:
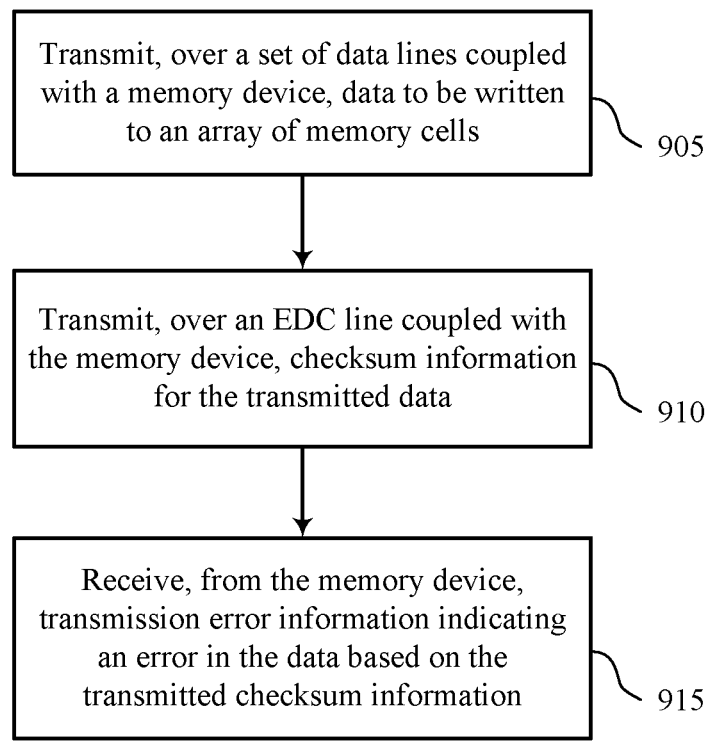

FIG. 9 shows a flowchart illustrating a method 900 that supports transmission failure feedback schemes for reducing crosstalk in accordance with examples as disclosed herein. The operations of method 900 may be implemented by a controller or its components as described with reference to FIGS. 1-6. For example, the operations of method 900 may be performed by a controller 305 as described with reference to FIG. 3 or a controller 405 as described with reference to FIG. 4. In some examples, the controller may execute a set of codes to control the functional elements of a device (e.g., a memory device 310, which may comprise a memory device 110) to perform the functions described herein.

At 905 the controller may transmit, over a set of data lines coupled with a memory device, data to be written to an array of memory cells. That is, the data may be transmitted by the controller as part of a write operation (e.g., including gapless write cycles). The operations of 905 may be performed according to the methods described with reference to FIGS. 1-6.

At 910 the controller may transmit, over an EDC line coupled with the memory device, checksum information for the transmitted data. In some cases, the checksum information may be transmitted at the same time as the data transmission. The operations of 910 may be performed according to the methods described with reference to FIGS. 1-6.

At 915 the controller may receive, from the memory device, transmission error information indicating an error in the data based on the transmitted checksum information. For example, the memory device may identify transmission errors based on the checksum the controller provided. In some cases, the controller may determine to rewrite the data that failed based on the received transmission error information and the indicated error. The operations of 915 may be performed according to the methods described with reference to FIGS. 1-6.

In some examples, an apparatus as described herein may perform a method or methods, such as the method 900. The apparatus may include features, means, or instructions (e.g., a non-transitory computer-readable medium storing instructions executable by a processor) for transmitting, over a set of data lines coupled with a memory device, data to be written to an array of memory cells, transmitting, over an EDC line coupled with the memory device, checksum information for the transmitted data, and receiving, from the memory device, transmission failure information indicating an error in the data based on the transmitted checksum information.

Some examples of the method 900, apparatuses, and non-transitory computer-readable medium described herein may further include operations, features, means, or instructions for receiving the transmission failure information over a first line coupled with the memory device, the first line being different than the EDC line.

Some examples of the method 900, apparatuses, and non-transitory computer-readable medium described herein may further include operations, features, means, or instructions for receiving a clock signal over a second line coupled with the memory device, the second line being different than the EDC line, where the clock signal may have a first frequency different than a second frequency of the received data.

Some examples of the method 900, apparatuses, and non-transitory computer-readable medium described herein may further include operations, features, means, or instructions for retransmitting the data to be written to the array of memory cells based on the transmission failure information indicating the error.

Some examples of the method 900, apparatuses, and non-transitory computer-readable medium described herein may further include operations, features, means, or instructions for receiving the transmission failure information and a clock signal over a first line coupled with the memory device. Some examples of the method 900, apparatuses, and non-transitory computer-readable medium described herein may further include operations, features, means, or instructions for decoding the transmission failure information using a first modulation scheme and decoding the clock signal using a second modulation scheme different than the first modulation scheme.

It should be noted that the methods described herein describe possible implementations, and that the operations and the steps may be rearranged or otherwise modified and that other implementations are possible. Further, aspects from two or more of the methods may be combined.

In some examples, an apparatus or device may perform aspects of the functions described herein. In some cases, the device may include an array of memory cells, a receiver coupled with a set of data lines and an EDC line, the receiver configured to receive data to be written to the array of memory cells via the set of data lines and to receive checksum information related to data received over the set of data lines, a comparator configured to detect errors in the data based on the checksum information, and one or more lines coupled with a controller and configured to transmit at least one of a clock signal or transmission failure information indicating a detected error in the data, the one or more lines being different than the EDC line.

In some examples, the device may include a first transmitter coupled with a first line of the one or more lines, the first transmitter configured to transmit the transmission failure information over the first line of the one or more lines. In some cases, the device may include a clock, and a second transmitter coupled with a second line of the one or more lines, the second transmitter configured to transmit a signal from the clock over the one or more lines.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
transmitting, from one or more controllers, an access command associated with data to be read from or written to an array of memory cells of a memory device; and
receiving, over an error detection code (EDC) line, information for detecting an error in the data corresponding to the access command, wherein the information for detecting the error in the data is received in accordance with a timing delay value that corresponds to a programmable delay.

2. The method of claim 1, wherein the timing delay value is from a set of one or more timing delay values.

3. The method of claim 2, wherein the set of one or more timing delay values are associated with a mode register of the memory device.

4. The method of claim 3, further comprising:
transmit, to the memory device, a signal indicating the set of one or more timing delay values.

5. The method of claim 4, wherein the signal indicating the set of one or more timing delay values is transmitted to the memory device during an initialization sequence.

6. The method of claim 4, wherein the signal indicating the set of one or more timing delay values comprises a command configuring the mode register of the memory device.

7. The method of claim 1, wherein the information for detecting the error in the data comprises a cyclic redundancy check (CRC) checksum.

8. An apparatus, comprising:
a memory device comprising an array of memory cells; and
one or more controllers coupled with the memory device and configured to:
transmit, to the memory device, an access command for data to be written to or read from the array of memory cells of the memory device; and
receive, from the memory device, a first signal comprising information for detecting an error in the data, wherein the first signal is received in accordance with a timing delay value that corresponds to a programmable delay.

9. The apparatus of claim 8, wherein the timing delay value is from a set of one or more timing delay values.

10. The apparatus of claim 9, wherein the set of one or more timing delay values are associated with a mode register of the memory device.

11. The apparatus of claim 10, wherein the one or more controllers are further configured to:
transmit, to the memory device, a signal indicating the set of one or more timing delay values.

12. The apparatus of claim 11, wherein the signal indicating the set of one or more timing delay values is transmitted to the memory device during an initialization sequence.

13. The apparatus of claim 11, wherein the signal indicating the set of one or more timing delay values comprises a command configuring the mode register of the memory device.

14. The apparatus of claim 8, wherein the information for detecting the error in the data comprises a cyclic redundancy check (CRC) checksum.

15. An apparatus, comprising:
one or more controllers configured to transmit, to a memory device, an access command for data to be written to or read from an array of memory cells; and
the memory device comprising the array of memory cells, the memory device configured to transmit, to the one or more controllers, a first signal comprising information for detecting an error in the data, wherein the first signal is received in accordance with a timing delay value that corresponds to a programmable delay.

16. The apparatus of claim 15, wherein the timing delay value is from a set of one or more timing delay values.

17. The apparatus of claim 16, wherein the set of one or more timing delay values are associated with a mode register of the memory device.

18. The apparatus of claim 17, wherein the one or more controllers is further configured to transmit, to the memory device, a signal indicating the set of one or more timing delay values.

19. The apparatus of claim 18, wherein the signal indicating the set of one or more timing delay values is transmitted to the memory device during an initialization sequence.

20. The apparatus of claim 18, wherein the signal indicating the set of one or more timing delay values comprises a command configuring the mode register of the memory device.

* * * * *